United States Patent [19]

Shagun et al.

[11] Patent Number: 4,961,832
[45] Date of Patent: Oct. 9, 1990

[54] APPARATUS FOR APPLYING FILM COATINGS ONTO SUBSTRATES IN VACUUM

[76] Inventors: Vladimir A. Shagun, ulitsa 50 let SSSR, I4, kv. 63; Vladimir A. Domrachev, ulitsa Sotsialisticheskaya, 47, kv. 64; Pavel S. Balykin, ulitsa Entuziastov, I, kv. 212; Jury V. Sokolov, ulitsa Kirova, 4I, kv. 63; Vitaly E. Lisitsyn, ulitsa Malo-lesopilnaya, 25; Vladimir P. Petrakov, ulitsa M. Rylskogo, 6/I, kv. I85, all of Ufa, U.S.S.R.

[21] Appl. No.: 323,560

[22] Filed: Mar. 14, 1989

[51] Int. Cl.$^5$ .............................................. C23C 14/34
[52] U.S. Cl. ........................... 204/298.07; 204/298.25
[58] Field of Search .................. 204/298 GF, 298 MC

[56] References Cited

U.S. PATENT DOCUMENTS 3,484,358 12/1969 Androshuk et al. ............ 204/192.12
3,691,053 9/1972 James et al. ........................ 204/298
4,606,929 8/1986 Petrakov ................................ 427/34

OTHER PUBLICATIONS

"Technology of Magnetron Spraying for Producing Thin Films for Electronic Industry", Leybold-Heraeus Co., Germany.

Primary Examiner—Aaron Weisstuch
Attorney, Agent, or Firm—Burgess, Ryan & Wayne

[57] ABSTRACT

The apparatus for applying film coatings onto substrates in vacuum comprises a vacuum working chamber with a holder of substrates and magnetron material sputtering units, an evacuation chamber equipped with magnetron pump and communicating with a gas source, a pre-evacuation pump, an auxiliary evacuation chamber with a magnetron pump, an auxiliary gas source and a system of conduits. The system includes a conduit equipped with a control valve, communicating the auxiliary gas source with the auxiliary evacuation chamber, and two conduits each with its control valve, communicating the respective gas sources with the working chamber.

4 Claims, 1 Drawing Sheet

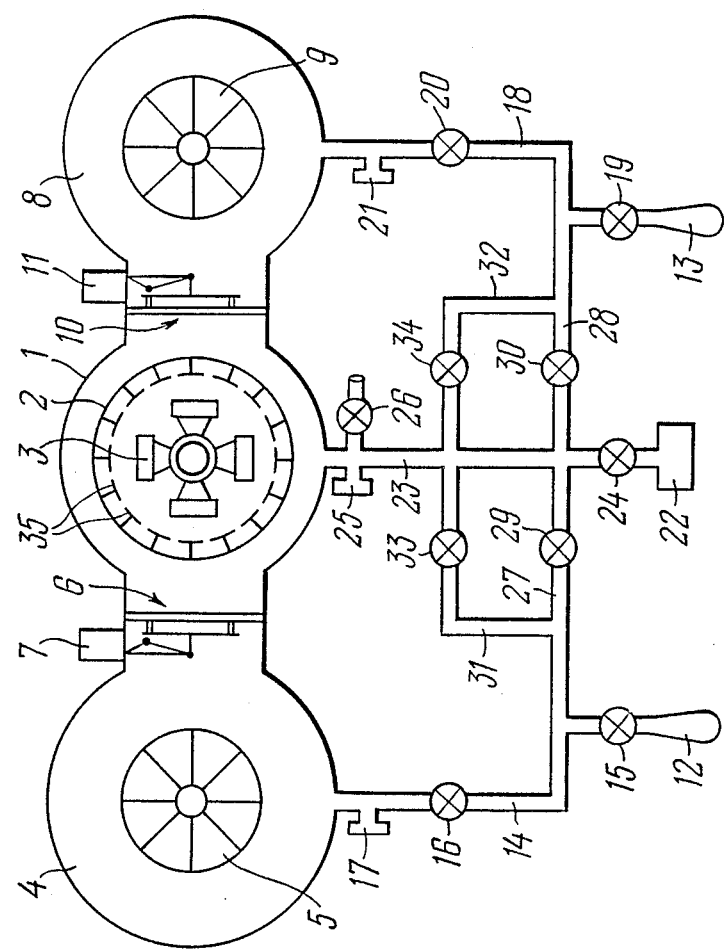

APPARATUS FOR APPLYING FILM COATINGS ONTO SUBSTRATES IN VACUUM

BACKGROUND OF THE INVENTION (1) Field of the Invention

The invention relates to vacuum technology, and more particularly it relates to an apparatus for applying film coatings onto substrates in vacuum by ion-plasma sputtering.

The invention can be implemented in vacuum ion-plasma sputtering technologies, e.g. application of coatings, etching, surface-hardening, fusing of materials (conductive, resistive, dielectric) in the manufacture of articles with complex coatings of diverse compositions. Articles treated in the disclosed apparatus for application of film coatings can be broadly utilized in electronic, engineering and metallurgical industries, and in optics.

(2) Description of the Related Art

When film coatings are applied onto articles in vacuum by ion-plasma sputtering processes, of essential importance for ensuring high quality and efficiency of the process are the use of a pure inert gas (e.g. argon) containing no impurities, as well as providing of broad capabilities for controlling the quantitative composition of the working gases and for boosted pumping-out of gases from the working chamber, i.e. the chamber where the actual sputtering operation is performed. All these essential features are dependent on the structure of the apparatus for applying film coatings.

There is known an apparatus for applying film coatings onto substrates in vacuum, which is a part of the Z-600 Unit for ion-plasma sputtering of thin films (B. Heinz, Leybold-Heraeus GmbH, Hanau, BRD "Technology of Magnetron Sputtering for Producing Thin Films for Electronic Industry"). The apparatus comprises a vacuum working chamber with a holder of substrates and at least one unit for magnetron sputtering of materials, an evacuation chamber with either a diffusion pump or a turbo-molecular pump, connected with the working chamber via a control valve, and a pre-evacuation pump communicating with the working chamber via a conduit including a control valve.

When this apparatus is operated for applying film coatings, the sputtering process involves the use of argon containing admixtures of active gases adversely effecting the quality of the coatings obtained (e.g. their adhesion, their chemical composition, etc.), eventually causing rejects and thus reducing the productivity. The operation of the apparatus is further characterized by inadequate stability of concentrations of the working gases; as either the diffusion pump or the turbo-molecular pump employed is capable of pumping out all the gases present (argon included). This, in its turn is liable to affect the parameters of the plasma generation process, the sputtering rate and chemical composition of the film coating, thus likewise causing rejects and reducing the productivity. Boosted pumping out of the gases from the working chamber in the course of the sputtering process might also cause defective film coatings on account of inadequate stability of the parameters of the plasma generation process.

There is further known an apparatus for applying film coating onto substrates in vacuum (U.S. Pat. No. 4,606,929), comprising a working chamber with a holder of substrates and at least one unit for magnetron sputtering of materials, an evacuation chamber connected with the working chamber via a control valve, provided with a magnetron pump and communicating via a first conduit including a control valve with a gas source, and a pre-evacuation pump having its working space communicating with the working chamber via a second conduit.

When this apparatus of the prior art is operated for reactive sputtering processes (which take a relatively long time and are critical from the view point of the chemical composition of the film coatings produced), and it is necessary to add some more argon to support the required process parameters (as argon pressure is liable to drop in the course of the sputtering operation), commercially available argon is employed, more often than not which contain active gases affecting the required chemical composition of the film coatings and their adhesion to the substrates. Thus, with argon added to the working chamber, some time is required for pumping out the active gases introduced by this argon replenishment by the magnetron pump, while chemical processes that are liable to develop in the plasma over this period of time are capable of causing defects in the film coatings obtained. Thus, the coatings obtained have to be subjected to additional tests and checks to introduce appropriate corrections into the successive photo-lithographic processes. Furthermore, it should be pointed out that the apparatus of the prior art involves complications in conducting reactive sputtering processes also on account of the fact that the valve it utilizes for controlling communication of the working chamber with the evacuation chamber is operable in two positions only, i.e. the "open" and "closed" positions. This hinders the maintenance of the required quantitative composition of the working gases, as the magnetron pump would pump out the working gases always at the maximum rate affecting the total pressure of the gases in the working chamber, which calls for frequent corrections of this pressure.

The apparatus of the prior art has no provisions for boosted pumping out of the active gases from the working chamber, as the magnetron pump it incorporates offers a fixed pumping-out rate. The apparatus is not operable during the periods of maintenance of either the magnetron pump or the pre-evacuation pump, and its time of preparation for the sputtering process is prolonged.

SUMMARY OF THE INVENTION

It is a principal object of the present invention to raise the quality of applied film coatings.

It is another object of the present invention to provide for infinite control of the quantitative composition of the working gases in reactive sputtering of film coatings.

It is a third object of the present invention to provide for boosted pumping-out of active gases-from the working chamber when short-duration sputtering processes are to be performed.

It is a fourth object of the present invention to enhance the productivity of application of film coatings in vacuum.

These and other objects are attained in an apparatus for applying film coatings onto substrates in vacuum, comprising a vacuum working chamber with a holder of substrates and at least one unit for magnetron sputtering of materials, an evacuation chamber connected with the working chamber through a control valve provided with a magnetron pump and communicating via a first conduit including a control valve with a source of gas, and a pre-evacuation pump having its working space connected with the working chamber via a second conduit. The apparatus, in accordance with the invention, further comprises an auxiliary evacuation chamber with a magnetron pump, communicating with the working chamber through a control valve, an auxiliary source of gas and a system of auxiliary conduits including a third conduit equipped with a valve for communicating the auxiliary gas source with the auxiliary evacuation chamber, and fourth and fifth conduits provided each with a valve for communicating the respective gas sources with the second conduit.

It is also useful for the apparatus to comprise sixth and seventh conduits, each provided with a leak, connected in parallel with the fourth and fifth conduits, respectively.

It is preferred that the valves controlling communication of the working chamber with the main and auxiliary evacuation chambers should be variable.

An apparatus for applying film coatings onto substrates in vacuum, constructed in accordance with the present invention, is operable for producing fine quality film coatings with high productivity.

With the apparatus according to the invention comprising an auxiliary evacuation chamber with its own magnetron pump, it has become possible to feed into the working chamber the inert gas (e.g. argon) already purified from active gases, to conduct boosted pumping-out of active gases for short-duration sputtering processes, to conduct uninterrupted sputtering process during the periods of maintenance of the magnetron pump (the main one) and of the pre-evacuation pump, to conduct prolonged and reaction-involving sputtering processes with high quality of the film coatings being obtained.

The communication of the auxiliary evacuation chamber with the working chamber through a variable flow control valve has provided for controlling the rate of pumping-out of gases from the working chamber, as well as for feeding the purified inert gas (e.g. argon) in metered quantities into the working chamber.

The incorporation in the apparatus of the auxiliary gas source has broadened the capacity of the apparatus for conducting sputtering processes, and had allowed performing a sputtering processes with simultaneous feed of several active gases into the working chamber.

The provision of the apparatus with the sixth and seventh conduits connected in parallel with the fourth and fifth conduits has allowed feeding of the respective gases into the working chamber through the leaks of these conduits, thus providing for fine metering of these gases.

BRIEF DESCRIPTION OF THE DRAWING

The invention will be further described in connection with its preferred embodiment, with reference being made to the accompanying drawing showing schematically an apparatus for applying film coatings onto substrates in vacuum, constructed in accordance with the invention.

DESCRIPTION OF THE PREFERRED EMBODIMENT

The apparatus for applying film coatings onto substrates in vacuum, illustrated schematically in the appended drawing, comprises a vacuum working chamber 1 accommodating a holder 2 of substrates and magnetron sputtering units 3 (there being four such units 3 for magnetron sputtering of materials in the embodiment being described).

Connected to the working chamber 1 at its one side is a main evacuation chamber 4 with its magnetron pump 5, communicating with the working chamber 1 through a variable-flow control valve 6 of which the movable valve member is rigidly connected with an actuator 7. Also connected to the working chamber 1 at its other side is auxiliary evacuation chamber 8 with an identical magnetron pump 9, communicating with the working chamber 1 through a variable-flow control valve 10 whose movable valve member is rigidly connected to an actuator 11. The apparatus further comprises the main and auxiliary gas sources 12 and 13, respectively, the main gas sources 12 communicating with the main evacuation chamber 4 via a conduit 14 including a gas pressure regulator 15, a control valve 16 and a gas pressure transducer 17.

The auxiliary gas source 13 communicates with the auxiliary evacuation chamber 8 via a conduit 18 including a gas pressure regulator 19, a control valve 20 and a gas pressure transducer 21. The apparatus still further comprises a pre-evacuation pump 22 having its working space communicating with the main working chamber via a conduit 23 including a control valve 24, a gas pressure transducer 25 and an air leak 26. The gas sources 12 and 13 are connected each with the conduit 23 via respective auxiliary conduits 27,28, each including its respective control valve 29 and 30. Running in parallel with the auxiliary conduits are conduits 31,32, each including its respective leak 33 and 34. The control valves 16,20,24,29 and 30 of the presently described embodiment are bypass valves. In the drawing, substrates 35 are shown on the holder 2 in the working chamber 1 of the apparatus.

The apparatus for applying film coatings onto substrates in vacuum of the embodiment being described is operated as follows:

Initially, the working chamber 1, the main evacuation chamber 4, and the auxiliary evacuation chamber 8 are unsealed. The control valves 6,10,16,20,24,29,30 the leaks 26,33,34, the gas pressure regulators 15,19 are closed. All the power supply sources are turned off. The operation is started by energizing the pre-evacuation pump 22, opening the control valves 16,20,24,29 and 30, to evacuate the working chamber 1, main evacuation chamber 4, and auxiliary evacuation chamber 8 to a pressure of 0.3–1.0 Pa. Then the valves 16,20,24,29, and 30 are closed, and the pre-evacuation pump 22 is deenergized. The gas pressure regulator 15 of the main source of gas (argon) is opened, the control valves 6 and 10 are opened to the maximum flow-passage area, the leak 33 is opened, and the inert gas is supplied into the working chamber 1, main evacuation chamber 4, and auxiliary evacuation chamber 8 to a pressure 1–10 Pa. Then the leak 33 is closed. The gas pressure regulator 15 is also closed, and the transducers 25,21, and 17 are used to monitor the pressure in the working chamber 1, main evacuation chamber 4 and auxiliary evacuation chamber 8.

Whenever necessary, if preferred, argon may be fed from the auxiliary gas source 13 through the leak 34. Then the magnetron pumps 5 and 9 are activated. While the magnetron pumps 5 and 9 are being started, some argon is consumed due to fixation of argon ions on the surface of the evacuation chambers 4 and 8. Thus, the argon pressure drops during the period of starting the magnetron pumps to 0.05–0.1 Pa in the working chamber 1, main evacuation chamber 4 and auxiliary evacuation chamber 8. With the starting period of the magnetron pumps 5 and 9 completed, the control valve 10 is closed, the control valve 20 is opened, and the gas pressure regulator 19 of the auxiliary gas source 13 is operated to set argon pressure in the auxiliary evacuation chamber 8 at 10 Pa. The valve 20 is then closed, the pressure regulator 19 is closed, too, and argon is cleaned of active gases in the auxiliary evacuation chamber 8 for 10–15 minutes, depending on the argon grade used. With the argon thus purified, the magnetron pump 9 is deactivated, and the variable flow control valve 10 is briefly opened to an appropriate intermediate position to set the working pressure of argon in the working chamber 1 and main evacuation chamber 4 at a 0.3–0.6 Pa level. The magnetron sputtering units 3 are activated to coat substrates 35 retained by the holder 2.

In case of prolonged sputtering processes, whenever addition of more argon is called for in the course of the sputtering process, the variable-flow control valve is briefly opened for a required period. With the sputtering operation completed, the magnetron sputtering units 3 are deactivated, the variable-flow control valve 6 is closed, and the magnetron pump 5 is turned off. The working chamber 1 is unsealed, and the coated substrates 35 are removed.

When successive sputtering cycles are performed, it is not necessary to re-start the magnetron pumps 5,9, as they are continuously ready for operation and are situated in the medium of argon at a pressure from 0.3 to 10 Pa (depending on the gastightness of the main evacuation chamber 4 and auxiliary evacuation chamber 8 and the time they remain in the inoperative state).

When short-duration processes requiring high rates of pumping out of the gases are to be performed (e.g. for producing extra chemically pure coatings or extra-thin coatings), the apparatus embodying the present invention is operated as follows:

Substrates 35 are loaded into the working chamber 1. The pre-evacuation pump 22 is energized, the control valve 24 is opened, and the working chamber 1 is evacuated to a pressure of 66 Pa. Then the valve 24 is closed and the pre-evacuation pump 22 is deenergized. The main magnetron pump 5 is activated, the variable-flow control valve 6 is opened to the maximum, and the working chamber 1 is evacuated to a 0.05–0.1 Pa pressure. By briefly opening the control valve 10, argon purified of active gases is added from the auxiliary evacuation chamber 8 to raise the argon pressure in the working chamber 1 and main evacuation chamber 4 to about 0.6 Pa. The pre-evacuation pump 22 is energized, the control valves 24,30 and 20 are opened, and argon is pumped out from the auxiliary evacuation chamber 8 to a pressure of 0.6 Pa. The valves 24,30 are also opened, and the pre-evacuation pump 22 and magnetron pump 9 are activated when it is necessary to purify argon in the auxiliary evacuation chamber 8 additionally. Then the control valve 10 is opened to the maximum degree, and the pumping out of the gases from the working chamber 1 is performed by both magnetron pumps 5 and 9, which provides for its boosted evacuation of gases.

With the working chamber 1 duly evacuated, the magnetron sputtering units 3 are activated to apply the required materials onto the substrates 35. With the sputtering operation completed, the magnetron sputtering units 3 are deactivated, and the control valves 6 and 10 are closed. The magnetron pump 5,9 are deenergized, the working chamber 1 is unsealed through the air leak 26, and the coated substrates 35 are unloaded.

In a process of reactive application of materials onto substrates 35, the apparatus embodying the present invention is operated as follows: The pre-evacuation pump 22 is energized, the control valve 24 is opened, and the working chamber 1 is evacuated via the conduit 23 to a pressure of 66 Pa. Then the valve 24 is closed, and the pre-evacuation pump 22 is deenergized. The magentron pump 5 is activated, the control valve 6 is opened, and the gases are pumped out from the working chamber 1 to a pressure of 0.05–0.1 Pa by the operation of the magnetron pump 5, after which the variable-flow control valve 6 is adjusted to an appropriate intermediate degree to maintain the required rate of pumping out of the active gases. The gas pressure regulators 15 and 19 of the respective main and auxiliary gas sources 12 and 13 are opened, and the required active gases are fed into the working chamber 1 via the conduits 31,32 through the open leaks 33,34, and then via the conduit 23. Each respective leak is adjusted to the required flow rate of the gas it feed. By intermittently briefly opening the variable-flow control valve 10, purified argon is supplied in successive portions from the auxiliary evacuation chamber 8. A working pressure of 0.6–0.9 Pa of the mixture of gases, e.g. Ar, $O_2$ and $N_2$, is set inside the working chamber 1. In the embodiment described, the working pressure is set and maintained in the working chamber 1 in the following manner. When the pressure in the working chamber 1 following its evacuation by the magnetron pump 5 is at 0.05–0.1 Pa, argon is added thereto through the variable flow control valve 10 to a pressure of 0.6 Pa; and then by operating either both leaks 33,34 or the appropriate one of them and adjusting the variable-flow control valve 6, the total working pressure of the gas mixture in the working chamber 1 is set at 0.9 Pa. As the rate of evacuation established by the magnetron pump 5 is constant (with the opening of the variable-flow control valve 6 being one and the same), and the rate of feed of the reactive gases through the respective leaks 33 and 34 is likewise constant, it is sufficient to regulate the feed of argon alone during the sputtering process by controlling the degree of opening of the valve 10. The magnetron sputtering units 3 are activated, and the materials are sputtered onto substrates 35 in the presence of the reactive gases. With the sputtering process completed, the control valve 6 is closed, the gas pressure regulators 15,19 and leaks 33,34 are likewise closed, and the magnetron sputtering units 3 are deactivated. The working chamber 1 is unsealed through the air leak 26, and the coated substrates 35 are unloaded.

The apparatus of the presently described embodiment is also operable for reactive sputtering processes with either three reactive gases or only one reactive gas, by employing in the case of three reactive gases the air leak 26 for feeding the third reactive gas.

In the presently disclosed apparatus for applying coatings onto substrates in vacuum the evacuation of the working chamber 1 to the initial vacuum of 66 Pa can be effected without using the pre-evacuation pump 22, in the following procedure.

The opening in the variable-flow control valve 6 is adjusted to the optimum passage of the gas flow, the magnetron pump 5 of the main evacuation chamber 4 is activated. The gases are pumped out from the working chamber 1 to a pressure of 66P by the magnetron pump 5. Then the control valve 6 is closed, adjusted to the maximum flow passage, and opened once again. Then the working chamber 1 is evacuated by the magnetron pump 5 to a pressure of 0.05-0.1 Pa. Now the working chamber 1 is ready for the sputtering process. Whenever necessary, the working chamber 1 can be evacuated to the initial vacuum of 66 Pa by joint operation of the magnetron pumps 5 and 9 through the respective open control valves 6 and 10.

The disclosed apparatus for applying film coatings onto substrates in a vacuum can be operated during periods when maintenance work is conducted on either one of the magnetron pumps 5 or 9 and on the pre-evacuation pump 22 without purification of argon as follows.

The magnetron pump 5 (9) is activated, arfd the control valve 6 (10) is adjusted for the minimum flow passage, whereafter the last-mentioned valve is opened to evacuate the working chamber 1 to the initial vacuum of 66P. Then the control valve 6 (10) is closed and adjusted to the maximum flow passage, re-opened, and gases are pumped out from the working chamber 1 to a pressure of 0.05-0.1 Pa. The gas pressure regulator 15 of the gas source 12 (or the gas pressure regulator 19 of the gas source 13) is opened, and argon is fed through the leak 33 (34) to raise the pressure in the working chamber 1 to 0.3-0.6 Pa. The magnetron units 3 are activated, and the sputtering process is performed. With the sputtering process completed, the magnetron spraying units 3 are deactivated, and the leak 33 (34) and gas pressure regulator 15 (19) are closed. The magnetron pump 5 (9) is deactivated. The working chamber 1 is unsealed by operating the air leak 26, and the coated substrates 35 are unloaded.

It can be seen from the above description that the disclosed apparatus for applying film coatings in vacuum:

provides for obtaining high-quality coatings by precluding the presence of active gases in argon supplied into the working chamber for conducting sputtering processes (prolonged, reactive or short-duration);

is operable for reinforced (boosted) evacuation duties by joint operation of the two magnetron pumps;

is operable for sputtering processes with unpurified argon, should either one of the magnetron pumps and the pre-evacuation pump either fail simultaneously or be put through a maintenance routine;

allows fine metering of active gases in a reactive sputtering process.

What is claimed is:

1. An apparatus for applying film coatings onto substrates in vacuum, comprising:
    a vacuum working chamber;
    a holder of substrates to be coated, accommodated in said vacuum working chamber;
    at least one unit for magnetron sputtering of materials of the coatings, arranged in said working chamber for the materials sputtered thereby to be deposited as films on said substrates held by said holder;
    a main evacuation chamber in communication with said working chamber through a first control valve means;
    a main magnetron pump arranged in said main evacuation chamber to evacuate gases from the chamber;
    a first gas source in communication with the main evacuation chamber by a first conduit means having a first valve means;
    a pre-evacuation pump in communication with the working chamber through a second conduit means having a second valve means;
    an auxiliary evacuation chamber in communication with said working chamber through a second control valve means;
    an auxiliary magnetron pump arranged in said auxiliary evacuation chamber to evacuate gases from the chamber;
    a second gas source in communication with the auxiliary evacuation chamber by a third conduit means having a third valve means;
    the first gas source in communication with the second conduit by a forth conduit means having a fourth valve means; and
    the second gas source in communication with said second conduit through a fifth conduit having a fifth valve means.

2. An apparatus as claimed in claim 1, comprising:
    a sixth conduit connected in parallel with said fourth conduit;
    a first leak mounted in said sixth conduit;
    a seventh conduit connected in parallel with said fifth conduit; and
    a second leak mounted in said seventh conduit.

3. An apparatus as claimed in claim 1, wherein said first and second control valves are variable-flow valve means.

4. An apparatus as claimed in claim 2, wherein said first and second control valves are variable-flow valve means.

* * * * *